(12) United States Patent
Sakamoto et al.

(10) Patent No.: US 9,968,003 B2
(45) Date of Patent: May 8, 2018

(54) COOLING DEVICE AND ELECTRONIC DEVICE

(71) Applicant: NEC Corporation, Tokyo (JP)

(72) Inventors: Hitoshi Sakamoto, Tokyo (JP); Minoru Yoshikawa, Tokyo (JP); Mahiro Hachiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days. days.

(21) Appl. No.: 15/110,888

(22) PCT Filed: Jan. 15, 2015

(86) PCT No.: PCT/JP2015/000163
§ 371 (c)(1),
(2) Date: Jul. 11, 2016

(87) PCT Pub. No.: WO2015/107899
PCT Pub. Date: Jul. 23, 2015

(65) Prior Publication Data
US 2016/0338226 A1 Nov. 17, 2016

(30) Foreign Application Priority Data

Jan. 16, 2014 (JP) .................................. 2014-005775

(51) Int. Cl.
*H05K 7/20* (2006.01)
*H01L 23/427* (2006.01)
(Continued)

(52) U.S. Cl.
CPC ..... *H05K 7/20336* (2013.01); *F28D 15/0266* (2013.01); *H01L 23/427* (2013.01);
(Continued)

(58) Field of Classification Search
CPC ......... H01L 2924/0002; H01L 2924/00; H01L 23/427; H01L 23/467; H01L 23/473;
(Continued)

(56) References Cited

U.S. PATENT DOCUMENTS 6,408,939 B1 * 6/2002 Sugimoto ............. F28D 1/0435
165/135
6,951,240 B2 * 10/2005 Kolb ...................... B60K 11/02
165/121
(Continued)

FOREIGN PATENT DOCUMENTS

| EP | 1531384 A2 | 5/2005 |
|---|---|---|
| JP | 2000-183259 A | 6/2000 |

(Continued)

OTHER PUBLICATIONS

International Search Report corresponding to PCT/JP2015/000163 dated Apr. 14, 2015 (2 pages).
(Continued)

*Primary Examiner* — Adam B Dravininkas
(74) *Attorney, Agent, or Firm* — Wilmer Cutler Pickering Hale and Dorr LLP

(57) ABSTRACT

A cooling device 100 includes a first heat receiving unit 400, a second heat receiving unit 410, a first heat dissipating unit 700, and a second heat dissipating unit 710. The first heat dissipating unit 700 and the second heat dissipating unit 710 have a flat plate shape and have a structure in which air passes in a direction approximately perpendicular to a principal surface having a flat plate shape and a first principal surface 730 that is a principal surface having a flat plate shape in the first heat dissipating unit 700 and a second principal surface 740 that is a principal surface having a flat plate shape in the second heat dissipating unit 710 are arranged so as to face to each other. As a result, the size of the cooling device 100 can be reduced without degrading a
(Continued)

heat dissipation performance to dissipate heat generated by a heat generating element.

8 Claims, 12 Drawing Sheets

(51) Int. Cl.
*H01L 23/467* (2006.01)
*F28D 15/02* (2006.01)

(52) U.S. Cl.
CPC ....... *H01L 23/467* (2013.01); *H05K 7/20136* (2013.01); *H05K 7/20327* (2013.01); *H05K 7/20409* (2013.01); *H05K 7/20436* (2013.01); *H05K 7/20809* (2013.01); *H01L 2924/0002* (2013.01)

(58) Field of Classification Search
CPC . H01L 2924/00014; H01L 2224/16225; H01L 2224/73253; H01L 2224/32225; H01L 23/4006; H01L 23/3677; H01L 2924/3011; H01L 23/367; H01L 23/4093; G06F 1/203; G06F 1/20; G06F 2200/201; G06F 1/206; G06F 2200/203; G06F 19/10; F28D 15/0266; F28D 15/0275; F28D 15/0233; F28D 15/00; F28D 15/046; F28D 15/02; F28D 15/06; F28D 2021/0029; F28D 2021/0031; H05K 7/20336; H05K 7/20772; H05K 7/20809; H05K 7/20781; H05K 7/20936; H05K 7/20263; H05K 7/20509; H05K 1/141; H05K 7/20; H05K 7/2039; H05K 7/20727

See application file for complete search history.

(56) References Cited

U.S. PATENT DOCUMENTS

| | | |
|---|---|---|
| 2005/0103477 A1 | 5/2005 | Kim et al. |
| 2006/0272798 A1 | 12/2006 | Liu et al. |
| 2007/0144713 A1* | 6/2007 | Sugimoto ............ F28D 1/0452 165/140 |
| 2007/0177350 A1* | 8/2007 | Hata ....................... G06F 1/203 361/697 |
| 2007/0273024 A1* | 11/2007 | Madsen ............. F28D 15/0266 257/715 |
| 2008/0037227 A1 | 2/2008 | Fujiwara |
| 2009/0056911 A1 | 3/2009 | Hongo |
| 2009/0129020 A1* | 5/2009 | Fujiwara ................ G06F 1/203 361/697 |
| 2009/0168331 A1 | 7/2009 | Fujiwara |
| 2011/0048676 A1 | 3/2011 | Toyoda et al. |
| 2011/0214840 A1* | 9/2011 | Sakamoto ............ F28D 15/0266 165/104.21 |
| 2014/0190738 A1* | 7/2014 | Sakamoto ................ G06F 1/20 174/548 |

FOREIGN PATENT DOCUMENTS

| | | |
|---|---|---|
| JP | 2002-168547 A | 6/2002 |
| JP | 2003-197839 A | 7/2003 |
| JP | 2005-195226 A | 7/2005 |
| JP | 2007-207835 A | 8/2007 |
| JP | 2007-310716 A | 11/2007 |
| JP | 2009-128947 A | 6/2009 |
| JP | 2011-047616 A | 3/2011 |

OTHER PUBLICATIONS

Extended European Search Report issued by the European Patent Office for European Application No. 15737056.0 dated Jul. 24, 2017 (8 pages).

* cited by examiner

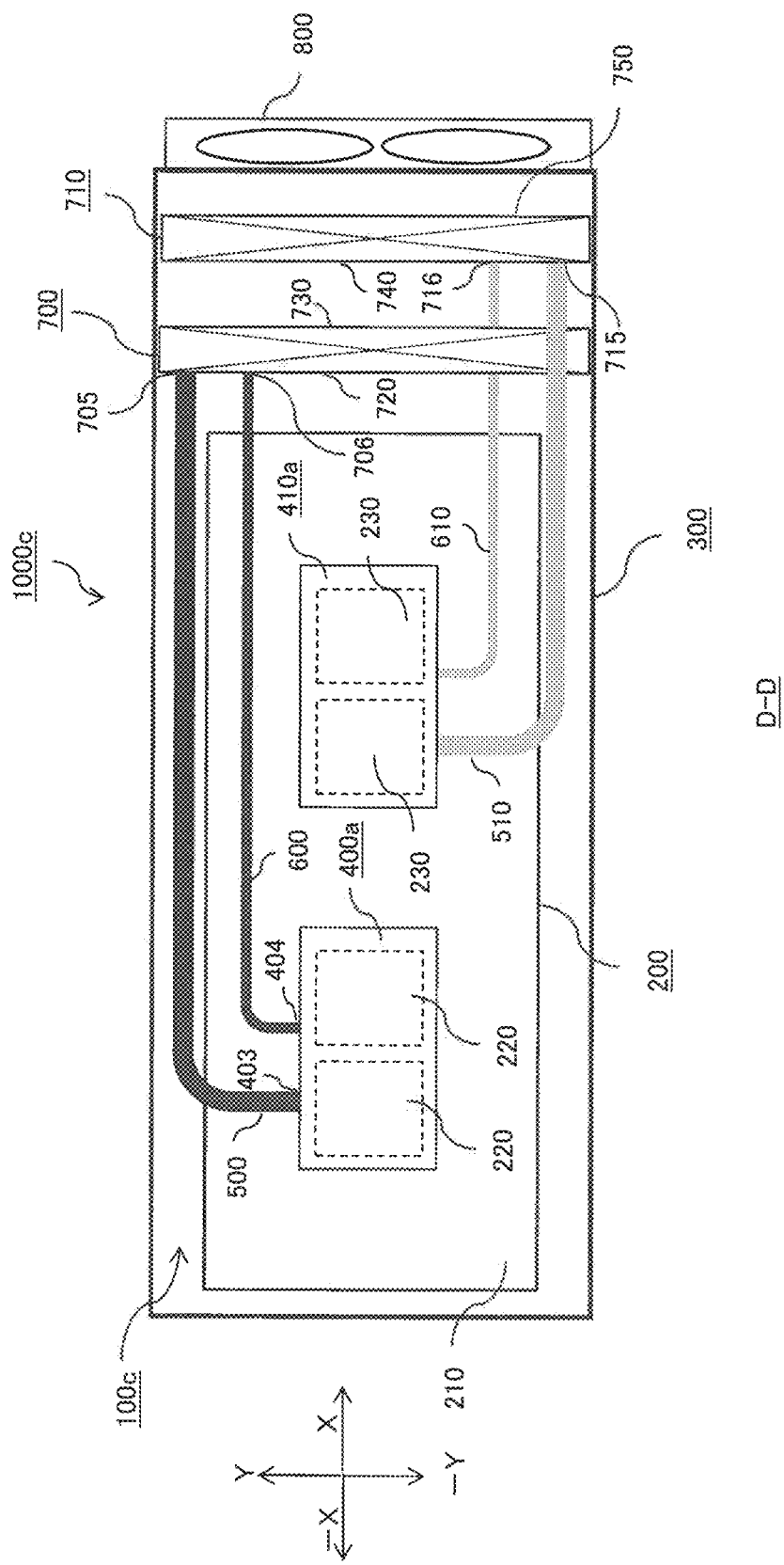

COOLING DEVICE AND ELECTRONIC DEVICE

CROSS-REFERENCE TO RELATED APPLICATIONS

This application is a national stage application of International Application No. PCT/JP2015/000163 entitled "Cooling Device and Electronic Device" filed on Jan. 15, 2015, which claims priority to Japanese Application No. 2014-005775 filed on Jan. 16, 2014, the disclosures of which are hereby incorporated by reference in their entirety.

TECHNICAL FIELD

The present invention relates to a cooling device, an electronic device, and the like, and particularly relates to, for example, a cooling device equipped with a cooling unit for dissipating heat of a heat generating element, an electronic device, and the like.

BACKGROUND ART

In recent years, the performance of an electronic device such as a computer or the like is rapidly improving and the function of it is being rapidly enhanced. With the improvement and enhancement of the electronic device, an amount of heat generated by an integrated circuit or the like used in the electronic device increases.

In such electronic device, a technology in which a cooling device dissipates heat generated by a heat generating element such as an integrated circuit or the like by using a phase change cooling system is known (for example, patent literatures 1 to 5). Further, in the cooling device using the phase change cooling system, a principle in which vapor accumulates in a vertically upper part is used and a thermal siphon-type cooling structure in which a heat receiving unit is provided in the lower part of the cooling device and a heat dissipating unit is provided in the upper part of the cooling device is adopted. By using this structure, a pump for circulating refrigerant is not required for the cooling device using the phase change cooling system.

In patent literature 1, a technology in which in an ebullient cooling device, the heat receiving unit and the heat dissipating unit are integrally formed and whereby, interference between a component around a heat generating body and a cooling tank can be prevented is disclosed.

In patent literature 2, a technology in which in the cooling device using a siphon effect, a condenser is disposed above a vaporizer in the vertical direction and whereby the power consumption and noise of the cooling device can be reduced is disclosed.

In patent literature 3, a technology in which in a pumpless cooling system, a heat radiator is disposed above a heat exchanger in the vertical direction (like the technology disclosed in patent literature 2) and one pipe is used for conveying refrigerant and whereby high reliability and low thermal resistance are realized is disclosed.

In patent literature 4, a technology in which in an ebullient cooler, a pipe having a two-layer structure through which refrigerant flows is used and whereby a liquid-phase flow path and a vapor-phase flow path are separated from each other and a high heat dissipation performance can be obtained is disclosed.

In patent literature 5, a technology of a cooling system and an electronic device in which in a cooling system which cools a plurality of heat generating elements, a plurality of heat dissipating units are disposed in line in a direction parallel to a width direction (a horizontally lateral direction) of a chassis of the electronic device and whereby a cool wind for cooling can be supplied to each of a plurality of the heat dissipating units is disclosed.

CITATION LIST

Patent Literature

[PTL 1] Japanese Patent Application Laid-Open No. 2000-183259
[PTL 2] Japanese Patent Application Laid-Open No. 2002-168547
[PTL 3] Japanese Patent Application Laid-Open No. 2005-195226
[PTL 4] Japanese Patent Application Laid-Open No. 2003-197839
[PTL 5] Japanese Patent Application Laid-Open No. 2011-047616

SUMMARY OF INVENTION

Technical Problem

However, when the technology described in patent literature 1 is used, the heat receiving unit that is in contact with the heat generating element, the heat dissipating unit, and a circulation path for refrigerant have to be integrally formed. Accordingly, a heat radiating fin of the heat dissipating unit is disposed in the vicinity of an integrated circuit or the like that is the heat generating element. In recent years, it is required to densely mount the integrated circuit and the like inside the electronic device. For this reason, when the technology described in patent literature 1 is used, there is a problem in that the size of the device increases because the heat dissipating unit is disposed in the vicinity of the heat generating element such as the integrated circuit or the like.

In the technology described in patent literature 2 and patent literature 3, when the heat dissipating unit is disposed above the heat receiving unit in the vertical direction, the heat receiving unit and the heat dissipating unit are separately disposed from each other and whereby the problem occurring when the technology described in patent literature 1 is used can be solved. However, there is a case in which the heat dissipating unit cannot be disposed above the heat receiving unit in the vertical direction because of the limitation of internal structure of the electronic device. Further, a problem in that refrigerant condenses in the pipe connecting the heat receiving unit and the heat dissipating unit occurs. In this case, a liquid film of refrigerant is formed inside the pipe and the refrigerant returns to the heat receiving unit located in the vertically lower part by the gravity. The liquid film of refrigerant and the refrigerant which returns to the heat receiving unit by the gravity not only act as a resistance to the vapor of refrigerant flowing toward the heat dissipating unit but also generate a pressure loss because a cross-sectional area of a path for vapor decreases. As a result, a problem of decreasing heat dissipation performance of the heat dissipating unit occurs.

When the technology described in patent literature 4 is used, by using the pipe having a two-layer structure through which refrigerant flows, the liquid-phase flow path and the vapor-phase flow path can be separated from each other. This resoles the problem occurring when the technology described in patent literatures 2 and 3 is used. However, there is a problem in which a pipe connection position at which the pipe is connected to the heat dissipating unit is limited because the pipe having a two-layer structure is used. Further, the vapor flowing in the vertically upper direction and the liquid flowing in a vertically lower direction coexist inside the heat dissipating unit and whereby the flow of refrigerant in the heat dissipating unit becomes unstable. As a result, there is a problem in which heat generated by the heat generating element cannot be sufficiently dissipated inside the heat dissipating unit.

In the technology described in patent literature 5, a plurality of the heat dissipating units are disposed in line in a direction parallel to the width direction (the horizontally lateral direction) of the chassis of the electronic device. Therefore, when an amount of heat generated by the heat generating element is large or the number of the heat generating elements is large, a large space is required to dispose a plurality of the heat dissipating units in line in the direction parallel to the horizontally lateral direction of the chassis. As a result, a problem in which the entire size of the device becomes large occurs when many electronic parts such as an integrated circuit and the like are mounted.

The present invention is made in view of the above mentioned situation. An object of the present invention is to provide a cooling device whose size can be reduced without degrading capability of dissipate heat generated by the heat generating element.

Solution to Problem

A cooling device of the present invention includes a first heat receiving unit and second heat receiving unit that receive heat generated by heat generating elements, a first heat dissipating unit that dissipates the heat received by the first heat receiving unit, and a second heat dissipating unit that dissipates the heat received by the second heat receiving unit, wherein the first heat dissipating unit and second heat dissipating unit each have a flat plate shape and have a structure in which air passes in a direction approximately perpendicular to a principal surface of the flat plate shape, and a first principal surface and a second principal surface are arranged so as to face to each other, the first principal surface being the principal surface of the flat plate shape of the first heat dissipating unit, the second principal surface being the principal surface of the flat plate shape of the second heat dissipating unit.

An electronic device of the present invention includes
a first heat receiving unit and second heat receiving unit that receive heat generated by heat generating elements, a first heat dissipating unit that dissipates the heat received by the first heat receiving unit, a second heat dissipating unit that dissipates the heat received by the second heat receiving unit, and a chassis that accommodates the cooling device, wherein the first heat dissipating unit and second heat dissipating unit each have a flat plate shape and have a structure in which air passes in a direction approximately perpendicular to a principal surface of the flat plate shape, and a first principal surface and a second principal surface are arranged so as to face to each other, the first principal surface being the principal surface of the flat plate shape of the first heat dissipating unit, the second principal surface being the principal surface of the flat plate shape of the second heat dissipating unit.

Advantageous Effects of Invention

By using the cooling device according to the present invention or the like, the size of the cooling device or the like can be reduced without deteriorating a function to dissipate heat generated by a heat generating element.

BRIEF DESCRIPTION OF DRAWINGS

FIG. 12 is a top perspective view showing a cross section along a line D-D in FIG. 11.

DESCRIPTION OF EMBODIMENTS

First Exemplary Embodiment

Figure 1:
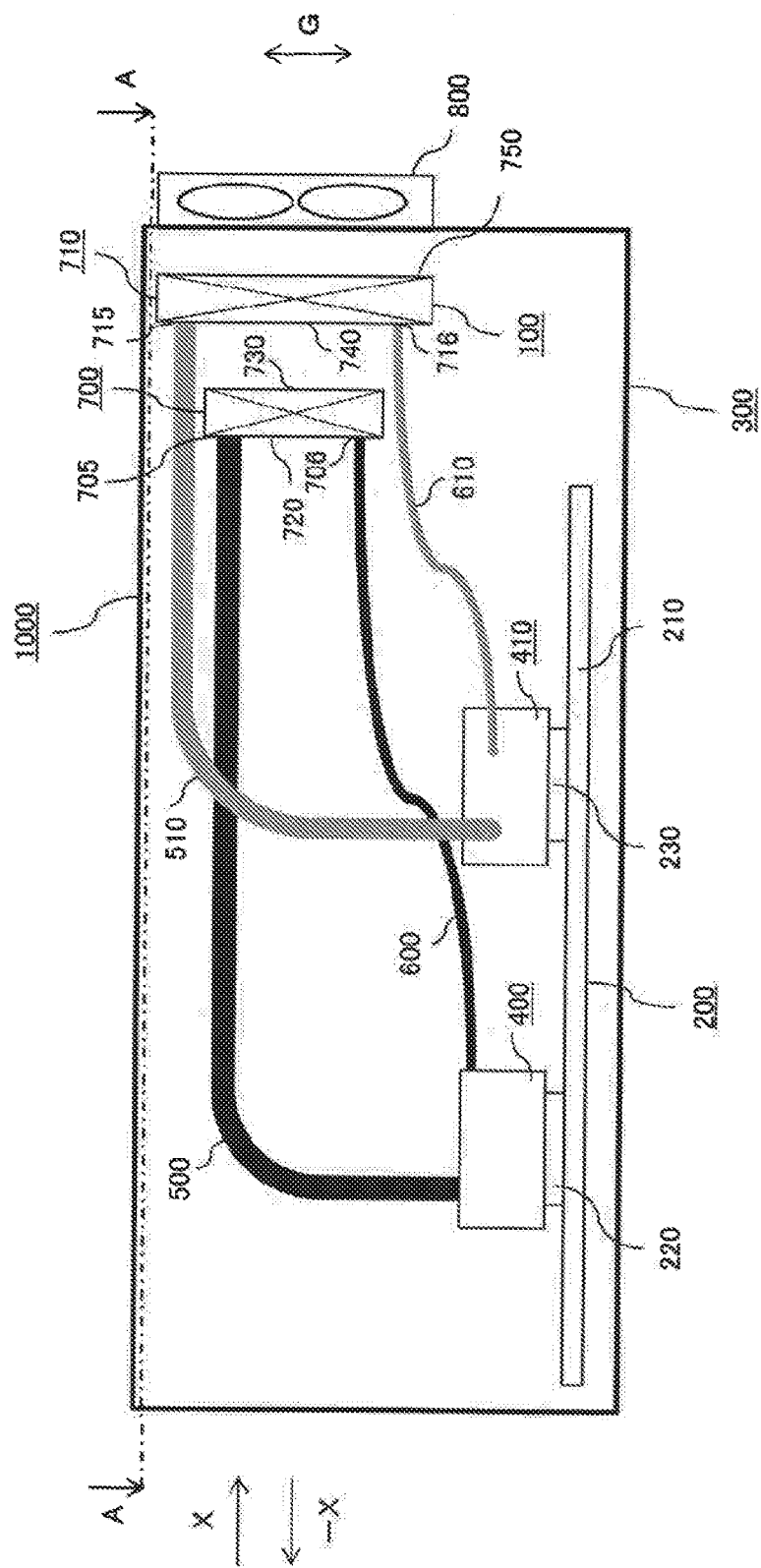
FIG. 1 is a side perspective view showing a structure of an electronic device including a cooling device according to a first exemplary embodiment of the present invention when viewed from a side.
Figure 2:
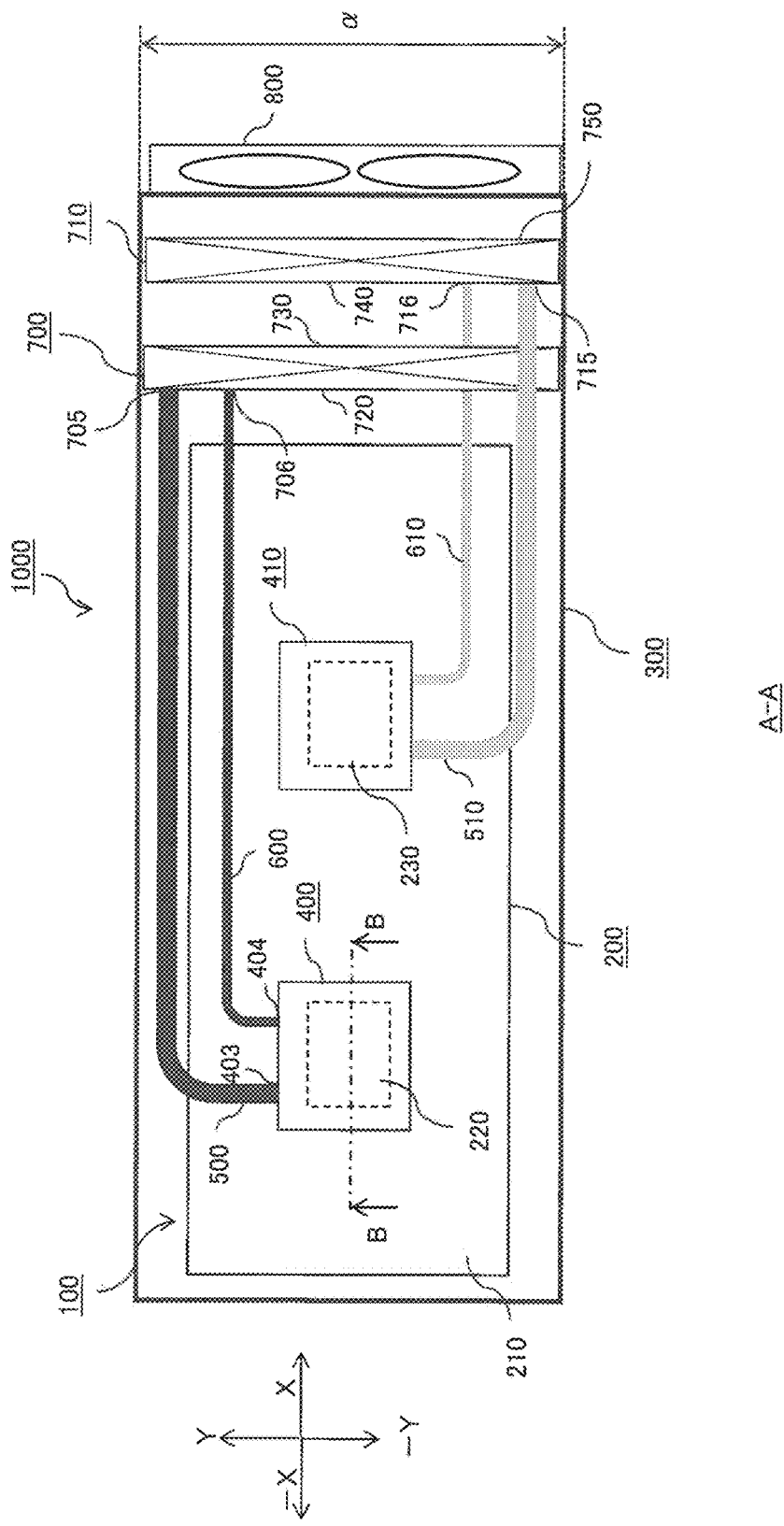
FIG. 2 is a top perspective view showing a cross section along a line A-A in FIG. 1.

A structure of an electronic device 1000 according to a first exemplary embodiment of the present invention will be described with reference to the drawings. FIG. 1 is a side perspective view showing the structure of the electronic device 1000 according to the first exemplary embodiment of the present invention when viewed from a side. FIG. 2 is a top perspective view showing a cross section along a line A-A in FIG. 1.

Further, an X direction and −X direction shown in FIG. 1 and FIG. 2 correspond to directions approximately perpendicular to a first principal surface 730 and a second principal surface 740, respectively. A Y direction and −Y direction shown in FIG. 2 correspond to lead-out directions of a first pipe unit and a second pipe unit mentioned later, respectively. Further, a G direction in FIG. 1 is a vertical direction. Further, the downward arrow of the G direction in FIG. 1 shows a direction of the gravitational force (vertically lower direction).

For convenience of explanation, first, an electronic substrate 200 will be described by using FIG. 1 and FIG. 2 before describing the configuration of the electronic device 1000.

As shown in FIG. 1 and FIG. 2, the electronic substrate 200 is composed of a substrate 210 and heat generating elements 220 and 230.

The substrate 210 is, for example, a printed wiring board formed in a plate shape. This substrate 210 has a structure in which the heat generating elements 220 and 230 can be mounted thereon. A flame retardant material such as, for example, glass epoxy or the like is used for a material of the substrate 210.

The heat generating elements 220 and 230 are, for example, electronic components such as a CPU (Central Processing Unit), an IC (Integrated Circuit), a power semiconductor, and the like. The heat generating element described above is an element which generates high-temperature heat when it operates. The heat generating elements 220 and 230 are mounted on the substrate 210 by soldering (not shown), for example. Alternatively, the heat generating elements 220 and 230 may be mounted on the substrate 210 by using for example, a socket (not shown) or the like.

The structure of the electronic substrate 200 has been described above.

Figure 3:
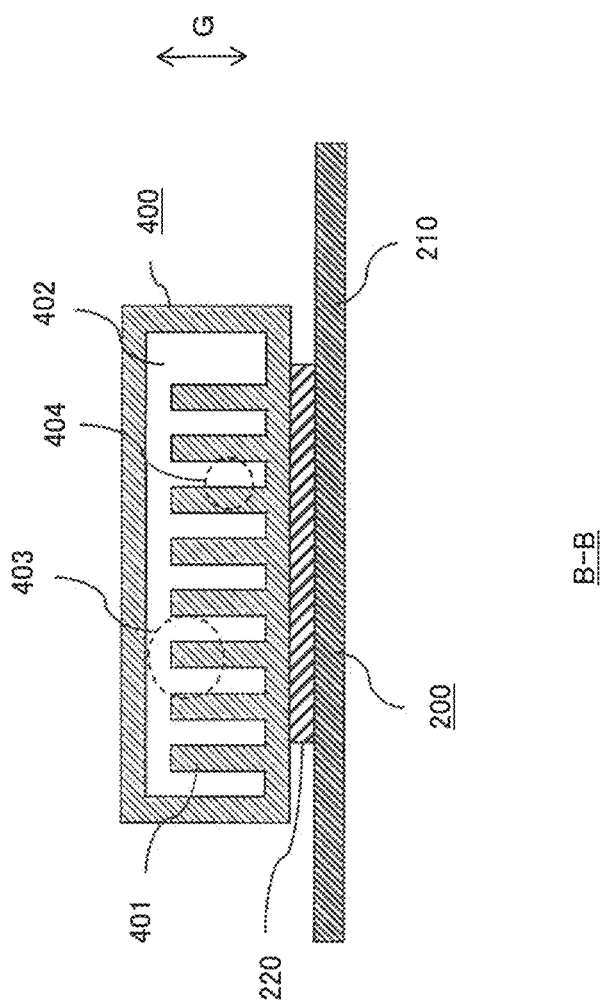
FIG. 3 is a cross-sectional view showing a cross section along a line B-B in FIG. 2.
Figure 4:
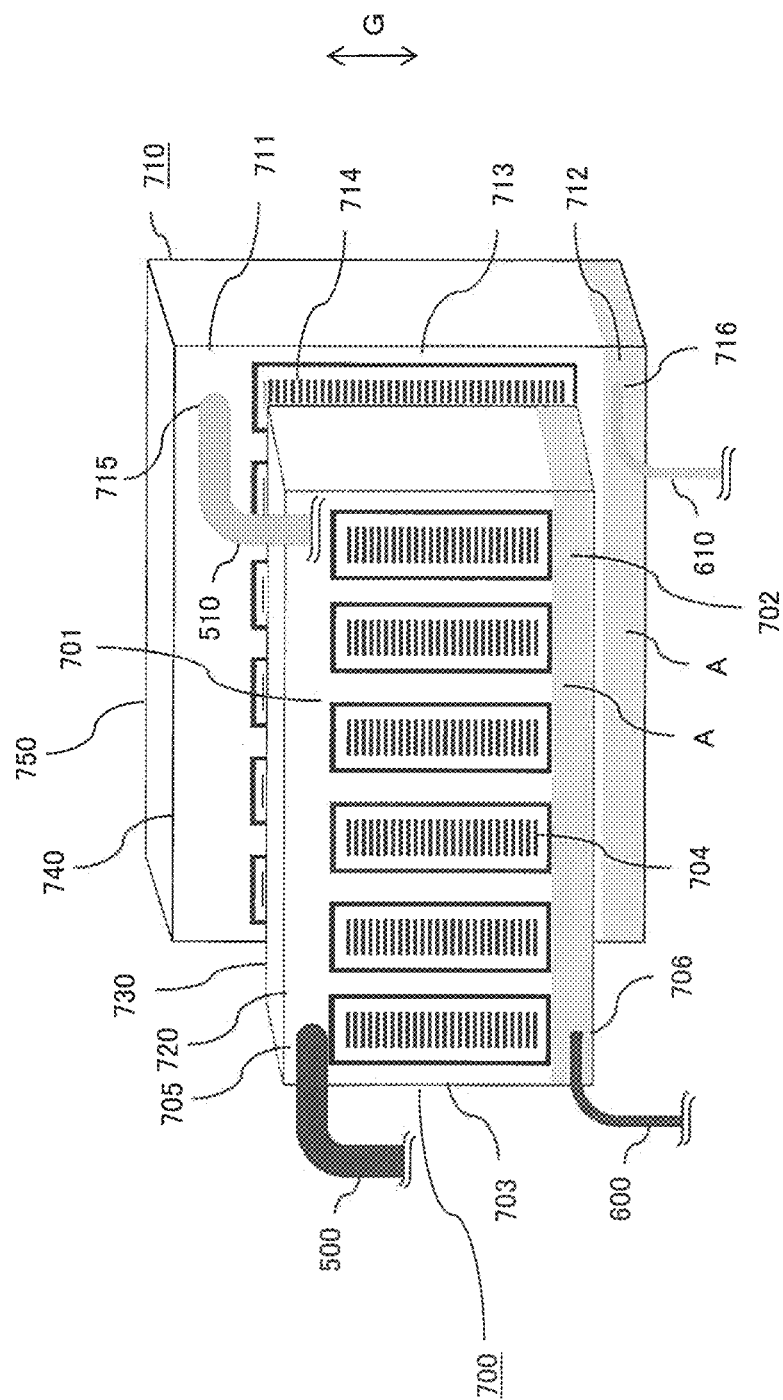
FIG. 4 is a perspective view showing a structure of a heat dissipating unit.
Figure 5:
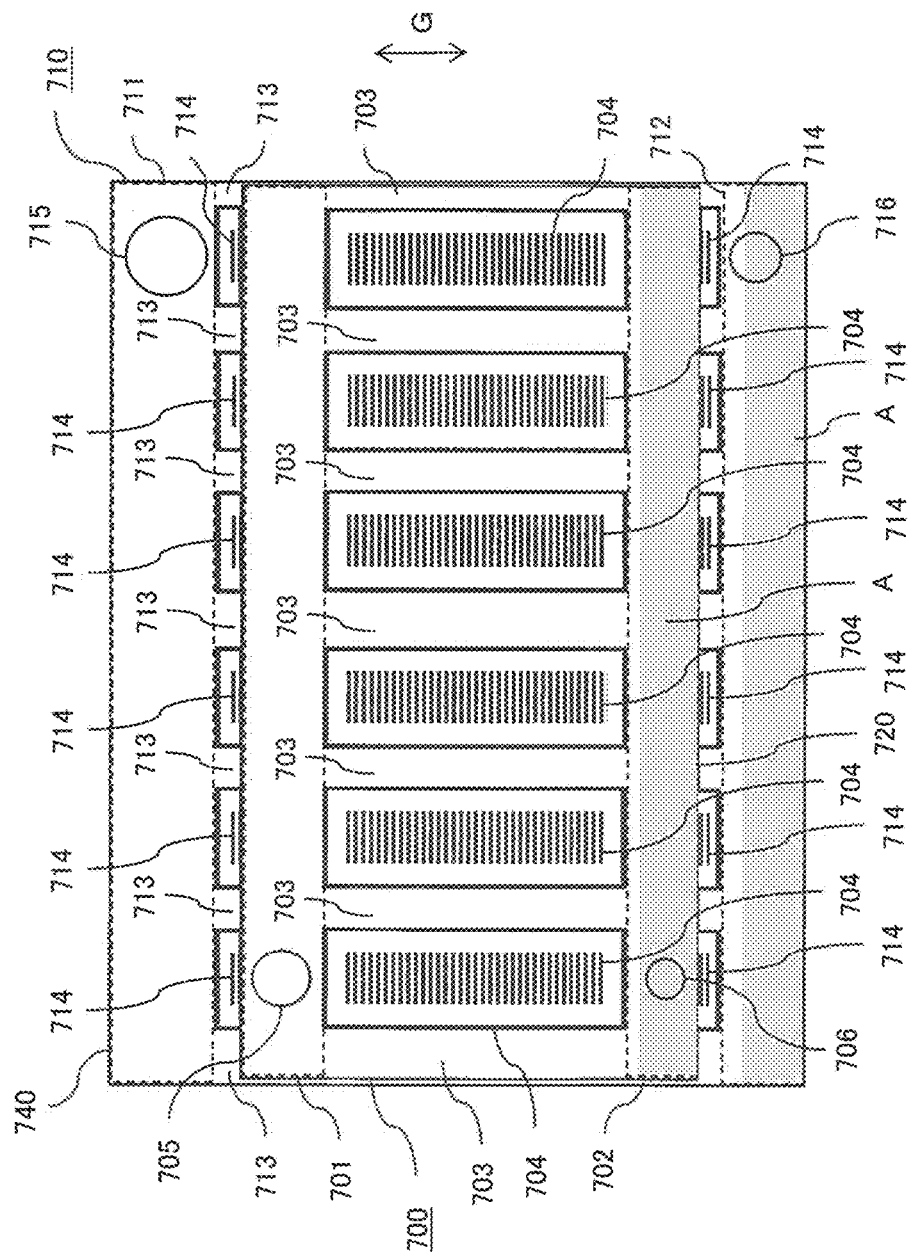
FIG. 5 is a front view showing a structure of a heat dissipating unit.

Next, the detailed structure of the electronic device 1000 will be described specifically with reference to FIG. 1 to FIG. 5. FIG. 3 is a cross-sectional view showing a cross section along a line B-B in FIG. 2. FIG. 4 is a perspective view showing a structure of a first heat dissipating unit 700 and a second heat dissipating unit 710. FIG. 5 is a front view showing the structure of the first heat dissipating unit 700 and the second heat dissipating unit 710.

As shown in FIG. 1 and FIG. 2, the electronic device 1000 is composed of at least a cooling device 100 and a chassis 300. The chassis 300 accommodates the cooling unit 100.

The cooling device 100 is composed of a first heat receiving unit 400 and a second heat receiving unit 410, a first vapor pipe 500 and a second vapor pipe 510, a first liquid pipe 600 and a second liquid pipe 610, a first heat dissipating unit 700 and a second heat dissipating unit 710, and a fan unit 800.

The cooling device 100 can be used for various electronic devices such as, for example, a server equipped with the heat generating element, a personal computer, a router, a Light Emitting Diode (LED) projector, a projector which utilizes a Liquid Crystal Display (LCD) or a Digital Micro mirror Device (DMD), a communication equipment, a wireless equipment, a broadcast equipment, and the like.

The basic structure of the cooling device 100 will be described before describing each component of the cooling device 100. In this cooling device 100, the heat generating element 220 is cooled by circulating refrigerant between a first heat receiving unit 400 and the first heat dissipating unit 700 while changing the phase of refrigerant (gas phase ↔ liquid phase). Similarly, in the cooling device 100, the heat generating element 230 is cooled by circulating refrigerant between a second heat receiving unit 410 and the second heat dissipating unit 710 while changing the phase of refrigerant (gas phase ↔ liquid phase).

As shown in FIG. 1 and FIG. 2, the first heat receiving unit 400 and the first heat dissipating unit 700 are connected by the first vapor pipe 500 and the first liquid pipe 600. Further, the second heat receiving unit 410 and the second heat dissipating unit 710 are connected by the second vapor pipe 510 and the second liquid pipe 610. Further, as described later, the first heat receiving unit 400, the second heat receiving unit 410, the first heat dissipating unit 700, and the second heat dissipating unit 710 are formed in a hollow shape. Namely, each of these units has a hollow space therein.

Further, refrigerant (not shown) is held in a closed space composed of the hollow space of the first heat receiving unit 400, the hollow space of the first heat dissipating unit 700, the hollow inside the first vapor pipe 500, and the hollow inside the first liquid pipe 600. This refrigerant circulates between the first heat receiving unit 400 and the first heat dissipating unit 700 via the first vapor pipe 500 and the first liquid pipe 600.

Specifically, because the specific gravity of vapor (gas-phase refrigerant) obtained by vaporizing refrigerant in the first heat receiving unit 400 is smaller than that of liquid-phase refrigerant, the vapor flows through the first vapor pipe 500 in the vertically upper direction and flows into the first heat dissipating unit 700. The gas-phase refrigerant is cooled inside the first heat dissipating unit 700 and condensed to a liquid. The liquid-phase refrigerant obtained by condensing the gas-phase refrigerant flows inside the first heat dissipating unit 700 in the vertically lower direction and flows into the first heat receiving unit 400 through the first liquid pipe 600.

Refrigerant is also held in a closed space composed of the hollow space of the second heat receiving unit 410, the hollow space of the second heat dissipating unit 710, the hollow inside the second vapor pipe 510, and the hollow inside the second liquid pipe 610. The refrigerant circulates between the second heat receiving unit 410 and the second heat dissipating unit 710 via the second vapor pipe 510 and the second liquid pipe 610 like the circulation between the first heat receiving unit 400 and the first heat dissipating unit 700.

The refrigerant is made of, for example, a high polymer material and the like. The refrigerant has a characteristic in which the refrigerant vaporizes at a high temperature and condenses at a low temperature.

Next, each member of which the cooling device 100 is composed will be described specifically.

First, the structure of the first heat receiving unit 400 and the second heat receiving unit 410 will be described by using FIG. 1 and FIG. 2. The first heat receiving unit 400 and the second heat receiving unit 410 are mounted on the heat generating element 220 and the heat generating element 230, respectively. The first heat receiving unit 400 and the second heat receiving unit 410 are thermally coupled to the heat generating elements 220 and 230, respectively. The first heat receiving unit 400 and the second heat receiving unit 410 receive the heat generated by the heat generating elements 220 and 230, respectively. The first heat receiving unit 400 and the second heat receiving unit 410 are disposed with the first heat dissipating unit 700 and the second heat dissipating unit 710, which will be mentioned later, along a direction (X direction and −X direction in FIG. 1 and FIG. 2) approximately perpendicular to the first principal surface 730 and the second principal surface 740, which will be described later.

As shown in FIG. 1 and FIG. 2, the first heat receiving unit 400 and the second heat receiving unit 410 are mounted on the heat generating elements 220 and 230 by using, for example, a screw (not shown) or the like, respectively.

In this case, it is desirable that the first heat receiving unit 400 and the second heat receiving unit 410 are pressed against the heat generating elements 220 and 230 at a pressure of, for example, about 100 to 500 kPa, respectively. A thermally conductive member such as, for example, aluminum, copper, or the like can be used as a material of the first heat receiving unit 400 and the second heat receiving unit 410.

Further, a material having good thermal conductivity (for example, thermally conductive grease (not shown), a heat dissipation sheet (not shown), a graphite sheet (not shown), various thin metal films (not shown) using indium or the like, or the like) may be interposed between the first heat receiving unit 400 and the heat generating element 220, and between the second heat receiving unit 410 and the heat generating element 230. When such material is disposed, the heat generated by the heat generating elements 220 and 230 are efficiently transferred to the first heat receiving unit 400 and the second heat receiving unit 410, respectively.

Here, the internal structure of the first heat receiving unit 400 will be described by using FIG. 3. Because the structure of the second heat receiving unit 410 is similar to that of the first heat receiving unit 400. Therefore, the description of the internal structure of the second heat receiving unit 410 will be omitted.

As shown in FIG. 3, the first heat receiving unit 400 includes a fin portion 401 for heat receiving unit, a refrigerant boiling portion 402, a vapor pipe side joining portion 403 for heat receiving unit, and a liquid pipe side joining portion 404 for heat receiving unit.

The refrigerant boiling portion 402 is formed in an internal space of the first heat receiving unit 400. In the refrigerant boiling portion 402, the refrigerant changes from the liquid-phase refrigerant to the gas-phase refrigerant by the heat generated by the heat generating element 220.

The fin portion 401 for heat receiving unit is formed in a plate shape, and a plurality of the fin portions 401 for heat receiving unit are arranged in the refrigerant boiling portion 402 of the first heat receiving unit 400. The fin portion 401 for heat receiving unit dissipates the heat generated by the heat generating element 220 and whereby, the temperature of the heat generating element 220 is reduced.

Here, in order to dissipate the heat, it is desirable that the fin portion 401 for heat receiving unit has a large surface area. For example, the fin portion 401 for heat receiving unit may have a bellows shape, a pinholder shape, or the like. Further, it is desirable that the distance between the adjacent fin portions 401 for heat receiving unit is approximately 1 mm to 3 mm or more in order to prevent air bubbles produced by boiling of the refrigerant from staying on the surface of each fin portion 401 for heat receiving unit.

The surface of the fin portion 401 for heat receiving unit may be polished to a surface finish roughness of, for example, several 10 μm to 100 μm by using a sandblasting process. This process increases the number of air bubbles produced on the surface of the fin portion 401 for heat receiving unit.

The vapor pipe side joining portion 403 for heat receiving unit and the liquid pipe side joining portion 404 for heat receiving unit are formed in the first heat receiving unit 400. The first vapor pipe 500 is connected to the vapor pipe side joining portion 403 for heat receiving unit, and the first liquid pipe 600 is connected to the liquid pipe side joining portion 404 for heat receiving unit. Because the gas-phase refrigerant flows in the vertically upper direction, it is desirable that the vapor pipe side joining portion 403 for heat receiving unit is disposed on the vertically upper side of the first heat receiving unit 400. On the other hand, it is desirable that the liquid pipe side joining portion 404 for heat receiving unit is disposed on the vertically lower side of in the first heat receiving unit 400 in order to prevent the gas-phase refrigerant from flowing into the first heat dissipating unit 700 through the first liquid pipe 600.

Next, the structure of the first vapor pipe 500, the second vapor pipe 510, the first liquid pipe 600, and the second liquid pipe 610 will be described by using FIG. 1 and FIG. 2.

The first vapor pipe 500 connects the first heat receiving unit 400 and the first heat dissipating unit 700 and coveys the refrigerant from the first heat receiving unit 400 to the first heat dissipating unit 700. The first liquid pipe 600 connects the first heat receiving unit 400 and the first heat dissipating unit 700 and conveys the refrigerant from the first heat dissipating unit 700 to the first heat receiving unit 400.

Here, the first vapor pipe 500 and the first liquid pipe 600 are collectively called the first pipe unit. Namely, in order to circulate the refrigerant between the first heat receiving unit 400 and the first heat dissipating unit 700, the first pipe unit connects the first heat receiving unit 400 and the first heat dissipating unit 700.

The second vapor pipe 510 connects the second heat receiving unit 410 and the second heat dissipating unit 710 and conveys the refrigerant from the second heat receiving unit 410 to the second heat dissipating unit 710. The second liquid pipe 610 connects the second heat receiving unit 410 and the second heat dissipating unit 710 and conveys the refrigerant from the second heat dissipating unit 710 to the second heat receiving unit 410.

Here, the second vapor pipe 510 and the second liquid pipe 610 are collectively called the second pipe unit. Namely, in order to circulate the refrigerant between the second heat receiving unit 410 and the second heat dissipating unit 710, the second pipe unit connects the second heat receiving unit 410 and the second heat dissipating unit 710.

The inner diameter of the first vapor pipe 500, the inner diameter of the second vapor pipe 510, the inner diameter of the first liquid pipe 600, and the inner diameter of the second liquid pipe 610 can be appropriately determined according to the required cooling performance of the electronic device 1000. For example, the inner diameter of the first vapor pipe 500 and the inner diameter of the second vapor pipe 510 may be 15 mm and the inner diameter of the first liquid pipe 600 and the inner diameter of the second liquid pipe 610 may be 10 mm. It is desirable that a pipe having a relatively large inner diameter is used for the first vapor pipe 500 and the second vapor pipe 510 so to minimize pressure loss.

On the other hand, it is desirable that a pipe having a relatively small inner diameter is used for the first liquid pipe 600 and the second liquid pipe 610. For example, the inner diameters of the first liquid pipe 600 and the second liquid pipe 610 may be made smaller than those of the first vapor pipe 500 and the second vapor pipe 510. This prevents the gas-phase refrigerant from flowing backward into the first heat dissipating unit 700 and the second heat dissipating unit 710 in the first heat receiving unit 400 and the second heat receiving unit 410.

Further, in a case that there is no risk of the gas-phase refrigerant flowing backward into the first heat dissipating unit 700 and the second heat dissipating unit 710 via the first liquid pipe 600 and the second liquid pipe 610, the inner diameters of the first liquid pipe 600 and the second liquid pipe 610 can be made equal to the inner diameters of the first vapor pipes 500 and the second vapor pipe 510. As a result, the fluidity of the refrigerant flowing in the first liquid pipe 600 and the second liquid pipe 610 is improved.

As shown in FIG. 2, the first vapor pipe 500 and the first liquid pipe 600 of the first pipe unit are led out from the first heat receiving unit 400 in the Y direction. The second vapor pipe 510 and the second liquid pipe 610 of the second pipe unit are led out from the second heat receiving unit 410 in the −Y direction.

Namely, the lead-out direction (Y direction in FIG. 2) of the first pipe unit that is led out from the first heat receiving unit 400 is opposite to the lead-out direction (−Y direction in FIG. 2) of the second pipe unit that is led out from the second heat receiving unit 410.

Next, the structures of the first heat dissipating unit 700 and the second heat dissipating unit 710 will be described by using FIGS. 1, 2, 4 and 5.

As shown in FIGS. 1, 2, 4 and 5, the first heat dissipating unit 700 is composed of an upper tank portion 701 (especially refer to FIG. 5), a lower tank portion 702 (especially refer to FIG. 5), a plurality of connection pipe portions 703 (especially refer to FIG. 5), a plurality of fin portions 704 for heat dissipating unit (especially refer to FIG. 5), a vapor pipe side joining portion 705 for heat dissipating unit, a liquid pipe side joining portion 706 for heat dissipating unit, a third principal surface 720 (especially refer to FIG. 1), and the first principal surface 730 (especially refer to FIG. 1). In particular, as shown in FIG. 5, the upper tank portion 701 (the portion surrounded by a dotted line in FIG. 5) and the lower tank portion 702 (the portion surrounded by a dotted line in FIG. 5) are connected by a plurality of the connection pipe portions 703 (in FIG. 5, seven connection pipe portions are shown). By connecting the upper tank portion 701, the lower tank portion 702, and a plurality of the connection pipes 703, the closed space is formed. In order to connect to this closed space, the first vapor pipe 500 is connected to the vapor pipe side joining portion 705 for heat dissipating unit disposed in the upper tank portion 701 and the first liquid pipe 600 is connected to the liquid pipe side joining portion 706 for heat dissipating unit disposed in the lower tank portion 702. In this case, a passage through which air passes is formed between a plurality of the connection pipes 703. A plurality of the fin portions 704 for heat dissipating unit are disposed on the passage of air. Namely, especially, as shown in FIG. 5, a plurality of the fin portions 704 for heat dissipating unit are disposed on the passage of air formed between a plurality of the connection pipe portions 703.

The structure of the second heat dissipating unit 710 is similar to that of the first heat dissipating unit 700. Namely, as shown in FIGS. 1, 2, 4 and 5, the second heat dissipating unit 710 is composed of an upper tank portion 711 (especially refer to FIG. 5), a lower tank portion 712 (especially refer to FIG. 5), a plurality of connection pipe portions 713 (especially refer to FIG. 5), a plurality of fin portions 714 for heat dissipating unit (especially refer to FIG. 5), a vapor pipe side joining portion 715 for heat dissipating unit, a liquid pipe side joining portion 716 for heat dissipating unit, the second principal surface 740 (especially refer to FIG. 1), and a fourth principal surface 750 (especially refer to FIG. 1). In particular, as shown in FIG. 5, the upper tank portion 711 (the portion surrounded by a dotted line in FIG. 5) and the lower tank portion 712 (the portion surrounded by a dotted line in FIG. 5) are connected by a plurality of the connection pipe portions 713 (in FIG. 5, seven connection pipe portions are shown). By connecting the upper tank portion 711, the lower tank portion 712, and a plurality of the connection pipes 713, the closed space is formed. In order to connect to this closed space, the second vapor pipe 510 is connected to the vapor pipe side joining portion 715 for heat dissipating unit disposed in the upper tank portion 711 and the second liquid pipe 610 is connected to the liquid pipe side joining portion 716 for heat dissipating unit disposed in the lower tank portion 712. In this case, a passage through which air passes is formed between a plurality of the connection pipes 713. A plurality of the fin portions 714 for heat dissipating unit are disposed on the passage of air. Namely, especially, as shown in FIG. 5, a plurality of the fin portions 714 for heat dissipating unit are disposed between a plurality of the connection pipe portions 713.

The first heat dissipating unit 700 and the second heat dissipating unit 710 dissipate the heat received by the first heat receiving unit 400 and the second heat receiving unit 410, respectively. As shown in FIG. 1 and FIG. 2, the first heat dissipating unit 700 and the second heat dissipating unit 710 are disposed with the first heat receiving unit 400 and the second heat receiving unit 410 along a direction (X direction and −X direction in FIGS. 1 and 2) approximately perpendicular to the first principal surface 730 and the second principal surface 740.

As shown in FIG. 1 and FIG. 2, the first heat dissipating unit 700 and the second heat dissipating unit 710 are formed in a flat plate shape. Further, the first principal surface 730 of the first heat dissipating unit 700 and the second principal surface 740 of the second heat dissipating unit 710 are arranged so as to face to each other.

Further, as shown in FIG. 1 and FIG. 2, the first principal surface 730 and the second principal surface 740 are formed in a rectangular shape. As shown in FIG. 2, a distance between both end sides of the first principal surface 730 and a distance between both end sides of the second principal surface 740 are set in accordance with the distance (a in FIG. 2) between the inner walls of the chassis 300. Namely, the end sides of the first principal surface 730 and the end sides of the second principal surface 740 that extend in the Y direction and −Y direction (horizontal direction) are in contact with the inner wall of the chassis 300.

Here, the internal structures of the first heat dissipating unit 700 and the second heat dissipating unit 710 will be described by using FIG. 4 and FIG. 5.

Each of the first heat dissipating unit 700 and the second heat dissipating unit 710 has the hollow space therein and store refrigerant (A in FIGS. 4 and 5) in the hollow space.

The upper tank portions 701 and 711 are disposed at the locations vertically higher than the locations of the lower tank portions 702 and 712, respectively.

As shown in FIG. 5, the connection pipe portion 703 of the first heat dissipating unit 700 connects the upper tank portion 701 and the lower tank portion 702. The connection pipe portion 713 of the second heat dissipating unit 710 connects the upper tank portion 711 and the lower tank portion 712. A plurality of the connection pipe portions 703 and a plurality of the connection pipe portions 713 are disposed.

The fin portion 704 for heat dissipating unit and the fin portion 714 for heat dissipating unit are disposed between the connection pipe portions 703. The fin portion 704 for heat dissipating unit and the fin portion 714 for heat dissipating unit dissipate heat of the gas-phase refrigerant conveyed from the upper tank portion 701 and the upper tank portion 711, respectively. When the heat of the refrigerant is dissipated, the refrigerant changes from the gas-phase refrigerant to the liquid-phase refrigerant and the liquid-phase refrigerant flow to the lower tank portions 702 and 712 through the connection pipe portions 703 and 713, respectively.

Each of the fin portion 704 for heat dissipating unit and the fin portion 714 for heat dissipating unit is composed of a plurality of fins and has a structure in which air can flow through the plurality of the fins. Namely, as shown in FIG. 1 and FIG. 2, in the first heat dissipating unit 700, in an area of the fin portion 704 for heat dissipating unit, air passes in the direction (X direction and −X direction in FIGS. 1 and 2) approximately perpendicular to the first principal surface 720 and the third principal surface 730. Similarly, in the second heat dissipating unit 710, in an area of the fin portion 714 for heat dissipating unit, air passes in the direction (X direction and −X direction in FIGS. 1 and 2) approximately perpendicular to the second principal surface 740 and the fourth principal surface 750.

The vapor pipe side joining portion 705 for heat dissipating unit and the vapor pipe side joining portion 715 for heat dissipating unit are formed in the upper tank portion 701 and the upper tank portion 711, respectively. The first vapor pipe 500 and the second vapor pipe 510 are connected to the vapor pipe side joining portion 705 for heat dissipating unit and the vapor pipe side joining portion 715 for heat dissipating unit, respectively.

The liquid pipe side joining portion 706 for heat dissipating unit and the liquid pipe side joining portion 716 for heat dissipating unit are formed in the lower tank portion 702 and the lower tank portion 712, respectively. The first liquid pipe 600 and the second liquid pipe 610 are connected to the liquid pipe side joining portion 706 for heat dissipating unit and the liquid pipe side joining portion 716 for heat dissipating unit, respectively.

Next, the structure of a fan unit 800 will be described with reference to a drawing. As shown in FIG. 1 and FIG. 2, the fan unit 800 is disposed outside the chassis 300 (shown in a right part of FIG. 1 and FIG. 2). As shown in FIG. 1 and FIG. 2, the fan unit 800 blows air to a facing area in which the first principal surface 730 and the second principal surface 740 face each other. As described above, in the first heat dissipating unit 700, in the area of the fin portion 704 for heat dissipating unit, air passes in the direction (X direction and −X direction in FIGS. 1 and 2) approximately perpendicular to the first principal surface 720 and the third principal surface 730. Similarly, in the second heat dissipating unit 710, in an area of the fin portion 714 for heat dissipating unit, air passes in the direction (X direction and −X direction in FIGS. 1 and 2) approximately perpendicular to the second principal surface 740 and the fourth principal surface 750. Accordingly, of the facing area in which the first principal surface 730 and the second principal surface 740 face each other in an area in which at least the fin portion 704 for heat dissipating unit and the fin portion 714 for heat dissipating unit overlap each other, air passes in the direction (X direction and −X direction in FIGS. 1 and 2) approximately perpendicular to the second principal surface 740 and the fourth principal surface 750. The fan unit 800 sends air to the area in which at least the fin portion 704 for heat dissipating unit and the fin portion 714 for heat dissipating unit overlap each other in the facing area in which the first principal surface 730 and the second principal surface 740 face to each other.

The facing area described above corresponds to an area in which the first heat dissipating unit 700 and the second heat dissipating unit 710 overlap each other when the first heat dissipating unit 700 and the second heat dissipating unit 710 are viewed in the X direction and the −X direction as shown in FIG. 5.

The fan unit 800 is disposed in such a way that the direction in which air is sent corresponds to the direction (X direction and −X direction in FIGS. 1 and 2) approximately perpendicular to the first principal surface 730 and the second principal surface 740.

In this structure, the fan unit 800 sends air in the X direction shown in FIG. 1 and FIG. 2 in the facing area. Namely, airflow generated by the fan unit 800 flows through the third principal surface 720, the first principal surface 730, the second principal surface 740, and the fourth principal surface 750 in this order in at least the facing area and air is discharged outside the chassis 300

Next, operation of the electronic device 1000 will be described with reference to the drawing.

First, when power of the cooling device 100 is turned on, mainly the heat generating elements 220 and 230 generate heat, and the temperature of the electronic substrate 200 increases. The first heat receiving unit 400 and the second heat receiving unit 410 receive heat generated by the heat generating elements 220 and 230, respectively. The first heat dissipating unit 700 and the second heat dissipating unit 710 dissipate the heat received by the first heat receiving unit 400 and the second heat receiving unit 410, respectively. As a result, in the electronic device 1000 including the cooling device 100, refrigerant is circulated while changing the phase of refrigerant and whereby the heat generated by the heat generating elements 220 and 230 on the electronic substrate 200 are dissipated.

Further, at this time, by the fan unit 800, air in the chassis 300 flows to the third principal surface 720, the first principal surface 730, the second principal surface 740, and the fourth principal surface 750 in this order in at least the facing area and air is discharged outside the chassis 300. As a result, the first heat dissipating unit 700 and the second heat dissipating unit 710 are cooled by air and the heat generated by the heat generating elements 220 and 230 on the electronic substrate 200 can be efficiently dissipated.

As described above, the cooling device 100 according to the first exemplary embodiment of the present invention includes the first heat receiving unit 400, the second heat receiving unit 410, the first heat dissipating unit 700, and the second heat dissipating unit 710. The first heat receiving unit 400 and the second heat receiving unit 410 receive the heat generated by the heat generating elements 220 and 230, respectively. The first heat dissipating unit 700 dissipates the heat received by the first heat receiving unit 400. The second heat dissipating unit 710 dissipates the heat received by the second heat receiving unit 410.

Further, the first heat dissipating unit 700 and the second heat dissipating unit 710 have a flat plate shape and have a structure in which air passes in a direction approximately perpendicular to the principal surface having a flat plate shape. Further, the first main surface 730 that is the principal surface having a flat plate shape in the first heat dissipating unit 700 and the second principal surface 740 that is the principal surface having a flat plate shape in the second heat dissipating unit 710 are arranged so as to face each other.

Accordingly, the size of the cooling device 100 can be reduced in comparison with a case in which the first heat dissipating unit 700 and the second heat dissipating unit 710 are disposed in parallel. Further, the first heat dissipating unit 700 dissipates the heat generated by the heat generating element 220 and the second heat dissipating unit 710 dissipates the heat generated by the heat generating element 230. Namely, the first heat dissipating unit 700 and the second heat dissipating unit 710 of the cooling device 100 dissipate the heat generated by the heat generating elements 220 and 230, respectively. Therefore, a heat dissipation function is not degraded.

Namely, the first heat dissipating unit 700 and the second heat dissipating unit 710 are arranged so as to face to each other. Therefore, the size of the cooling device 100 can be reduced without degrading the function to dissipate the heat generated by the heat generating elements 220 and 230.

Further, in the cooling device 100 according to the first exemplary embodiment of the present invention, refrigerant is circulated between the first heat receiving unit 400 and the first heat dissipating unit 700 while changing the phase of the refrigerant (gas phase ↔ liquid phase) and whereby the heat generating element 220 can be cooled. Similarly, refrigerant is circulated between the second heat receiving unit 410 and the second heat dissipating unit 710 while changing the phase of the refrigerant (gas phase ↔ liquid phase) and whereby the heat generating element 230 can be cooled. Namely, the cooling device 100 uses a phase change cooling system. Therefore, the thermal resistances of the heat generating elements 220 and 230 can be reduced compared with an air-cooling type cooling device.

Further, the cooling device 100 according to the first exemplary embodiment of the present invention includes the fan unit 800. The fan unit 800 sends air to the facing area in which the first principal surface 730 and the second main surface 740 face to each other in the first principal surface 730 and the second principal surface 740.

Namely, because the fan unit 800 can directly send air to both the first heat dissipating unit 700 and the second heat dissipating unit 710, the first heat dissipating unit 700 and the second heat dissipating unit 710 can be cooled at the same time. As a result, the heat generated by the heat generating elements 220 and 230 can be efficiently dissipated.

Further, when the first heat dissipating unit 700 and the second heat dissipating unit 710 are disposed in parallel, the fan unit 800 has to be provided for each of the first heat dissipating unit 700 and the second heat dissipating unit 710. In contrast, because the first principal surface 730 and the second principal surface 740 are arranged so as to face to each other in order to make the facing area, when air is sent to the facing area by using one fan unit 800, both the first heat dissipating unit 700 and the second heat dissipating unit 710 can be cooled. As a result, the cost, the power consumption, and the size of the cooling device 100 can be reduced.

Further, in the cooling device 100 according to the first exemplary embodiment of the present invention, the first principal surface 730 and the second principal surface 740 are formed in a rectangular shape. The distance between the both edges in a surface direction (the Y direction and the −Y direction in FIG. 2) of the first principal surface 730 and the second principal surface 740 corresponds to the distance a between the inner walls of the chassis 300 which accommodates the first heat receiving unit 400, the second heat receiving unit 410, the first heat dissipating unit 700, and the second heat dissipating unit 710.

Therefore, when the distance a between the inner walls of the chassis 300 is maximally effectively used, the dissipation areas of the first heat dissipating unit 700 and the second heat dissipating unit 710 can be made maximum. As a result, the heat generated by the heat generating elements 220 and 230 can be further effectively dissipated.

Further, because the heat dissipation areas of the first heat dissipating unit 700 and the second heat dissipating unit 710 can be made large in a horizontal direction (the Y direction and the −Y direction in FIG. 2) that is a direction approximately perpendicular to the vertical direction, the pressure loss of refrigerant flowing in the vertical direction can be reduced in the first heat dissipating unit 700 and the second heat dissipating unit 710. As a result, the fluidity of the refrigerant in the first heat dissipating unit 700 and the second heat dissipating unit 710 can be increased and the heat generated by the heat generating elements 220 and 230 can be further effectively dissipated.

Further, in the cooling device 100 according to the first exemplary embodiment of the present invention, the first heat receiving unit 400, the second heat receiving unit 410, the first heat dissipating unit 700, and the second heat dissipating unit 710 are disposed along the direction (X direction and −X direction in FIG. 1) approximately perpendicular to the first principal surface 730 and the second principal surface 740. Therefore, the size of the cooling device 100 can be made small in comparison with a case in which the first heat dissipating unit 700 and the second heat dissipating unit 710 are disposed side by side.

Further, the cooling device 100 according to the first exemplary embodiment of the present invention includes the first pipe unit and the second pipe unit. In order to circulate refrigerant between the first heat receiving unit 400 and the first heat dissipating unit 700, the first pipe unit connects the first heat receiving unit 400 and the first heat dissipating unit 700. In order to circulate refrigerant between the second heat receiving unit 410 and the second heat dissipating unit 710, the second pipe unit connects the second heat receiving unit 410 and the second heat dissipating unit 710. The lead-out direction (the Y direction in FIG. 2) in which the first pipe unit is leaded out from the first heat receiving unit 400 is opposite to the lead-out direction (the −Y direction in FIG. 2) in which the second pipe unit is leaded out from the second heat receiving unit 410.

This reduces a risk of entanglement between the first pipe unit and the second pipe unit. Therefore, for example, maintenance and replacement of the first pipe unit and the second pipe unit can be easily performed.

Further, the electronic device 1000 according to the first exemplary embodiment of the present invention includes the cooling device 100 and the chassis 300. The chassis 300 accommodates the cooling device 100. The cooling device 100 includes the first heat receiving unit 400 and the second heat receiving unit 410 which receive the heat generated by the heat generating elements 220 and 230 respectively, the first heat dissipating unit 700 which dissipates the heat received by the first heat receiving unit 400, and the second heat dissipating unit 710 which dissipates the heat received by the second heat receiving unit 410. The first heat dissipating unit 700 and the second heat dissipating unit 710 have a flat plate shape and have a structure in which air passes in a direction approximately perpendicular to the principal surface having the flat plate shape and wherein the first principal surface 730 that is the principal surface having a flat plate shape in the first heat dissipating unit 700 and the second principal surface 740 that is the principal surface having a flat plate shape in the second heat dissipating unit 710 are arranged so as to face to each other.

This electronic device 1000 has functions and effects similar to those of the cooling device 100 mentioned above.

Second Exemplary Embodiment

Figure 6:
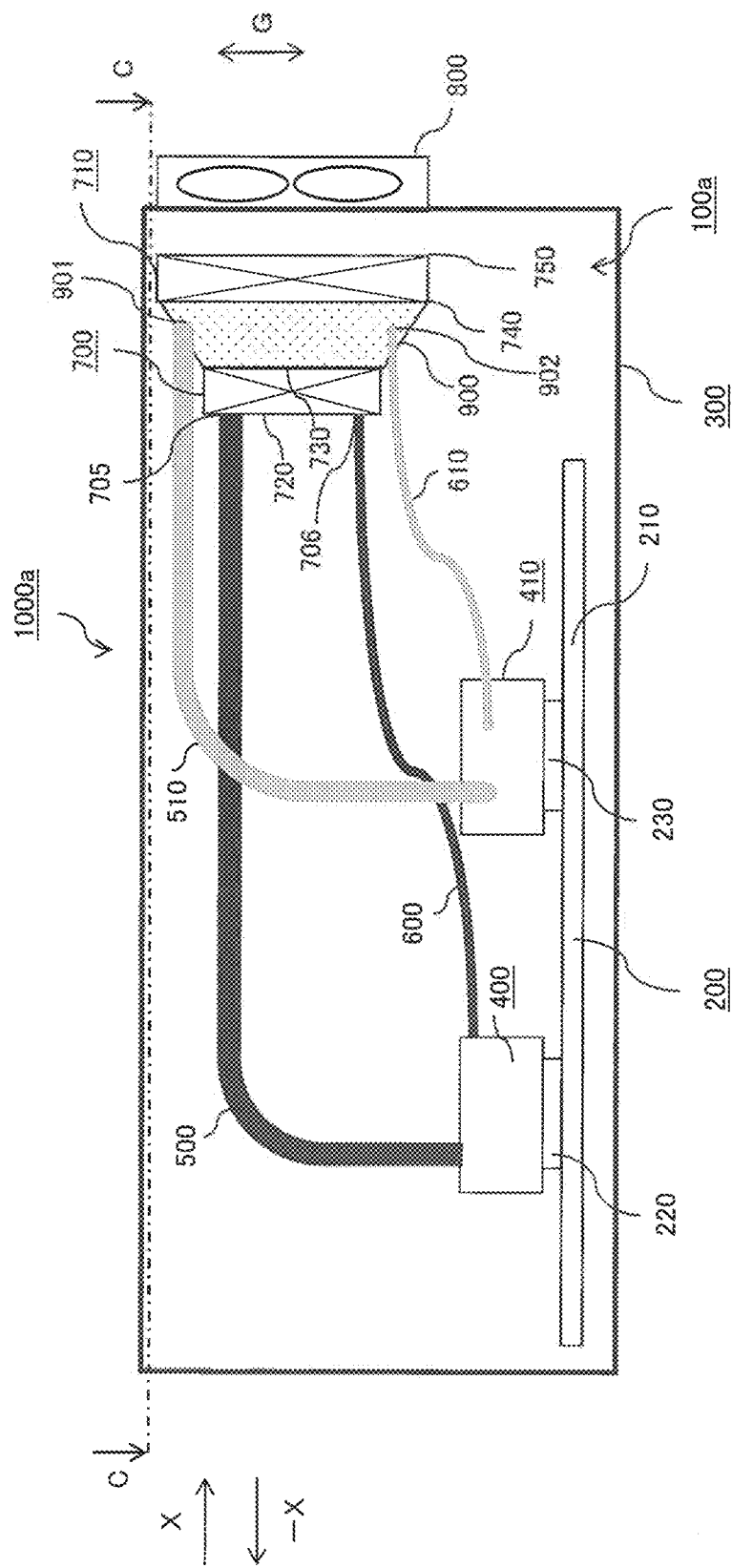
FIG. 6 is a side perspective view showing a structure of an electronic device including a cooling device according to a second exemplary embodiment of the present invention when viewed from a side.
Figure 7:
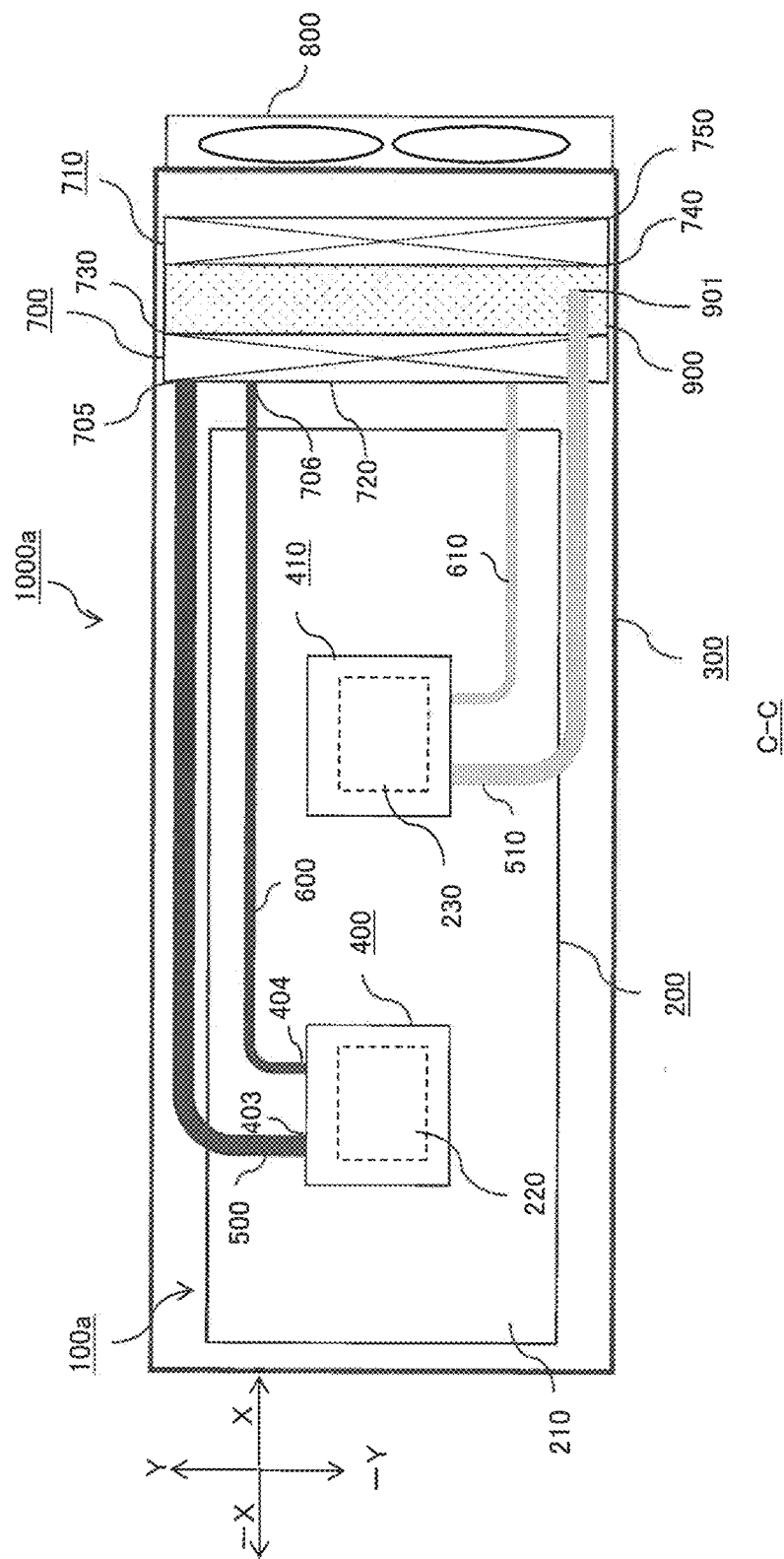
FIG. 7 is a top perspective view showing a cross section along a line C-C in FIG. 6.
Figure 8:
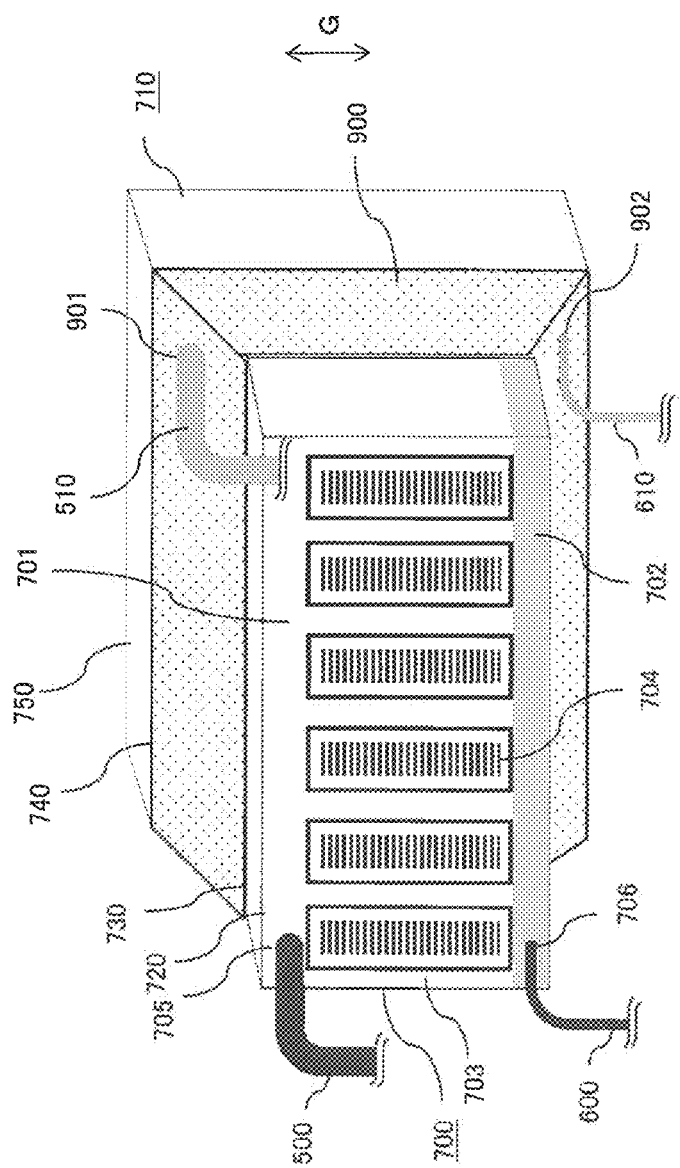
FIG. 8 is a perspective view showing a connection relationship between a heat dissipating unit and a cover portion.

A detailed structure of a cooling device 100a according to a second exemplary embodiment of the present invention will be described by using FIG. 6 to FIG. 8. FIG. 6 is a side perspective view showing a structure of an electronic device 1000a including the cooling device 100a according to the second exemplary embodiment of the present invention when viewed from the side. FIG. 7 is a top perspective view showing a cross section along a line C-C in FIG. 6. FIG. 8 is a perspective view showing a connection relationship between the first heat dissipating unit 700/the second heat dissipating unit 710 and a cover portion 900.

In FIG. 6 to FIG. 8, same reference numerals are used to denote elements equivalent to those shown in FIG. 1 to FIG. 5.

The electronic device 1000a is composed of the cooling device 100a and the chassis 300.

As shown in FIG. 6, the cooling device 100a is composed of the first heat receiving unit 400, the second heat receiving unit 410, the first vapor pipe 500, the second vapor pipe 510, the first liquid pipe 600, the second liquid pipe 610, the first heat dissipating unit 700, the second heat dissipating unit 710, the fan unit 800, and the cover portion 900.

Here, the structure shown in FIG. 1 is compared with the structure shown in FIG. 6. The cooling device 100a shown in FIG. 6 further includes the cover portion 900. This is a difference between the cooling device 100 shown in FIG. 1 and the cooling device 100a shown in FIG. 6. Therefore, in the following description, the description about the structure that is the same as the structure shown in FIG. 1 to FIG. 5 will be omitted.

As shown in FIG. 6 to FIG. 8, the cover portion 900 connects the outer peripheral edge of the first principal surface 730 and the outer peripheral edge of the second principal surface 740. A metal such as aluminum, copper, or the like or a resin such as a plastic, rubber, or the like may be used for a material of the cover portion 900. The cover portion 900 may be fixed to the outer peripheral edges of the first principal surface 730 and the second principal surface 740 by using, for example, a screw or the like.

Further, the cover portion 900 includes a vapor pipe side opening 901 for cover portion and a liquid pipe side opening 902 for cover portion.

As shown in FIG. 6 to FIG. 8, the vapor pipe side opening 901 for cover portion is formed at a position that matches the vapor pipe side joining portion 715 for heat dissipating unit of the second heat dissipating unit 710. Further, the inner diameter of the vapor pipe side opening 901 for cover portion corresponds to the outer diameter of the second vapor pipe 510.

As shown in FIG. 6 and FIG. 8, the liquid pipe side opening 902 for cover portion is formed at a position that matches the liquid pipe side joining portion 716 for heat dissipating unit of the second heat dissipating unit 710. Further, the inner diameter of the liquid pipe side opening 902 for cover portion corresponds to the outer diameter of the second liquid pipe 610.

As described above, the cooling device 100a according to the second exemplary embodiment of the present invention includes the cover portion 900. The cover portion 900 connects the outer peripheral edge of the first principal surface 730 and the outer peripheral edge of the second principal surface 740.

Here, for example, it is assumed that air flows to the third principal surface 720, the first principal surface 730, the second principal surface 740, and the fourth principal surface 750 in this order like the cooling device 100 according to the first exemplary embodiment. In this case, because the cover portion 900 connects the outer peripheral edge of the first principal surface 730 and the outer peripheral edge of the second principal surface 740, air flowing from the first principal surface 730 to the second principal surface 740 does not leak to the outside of the cover portion 900.

Accordingly, the air flowing in the third principal surface 720 flows out from the fourth principal surface 750. As a result, the first heat dissipating unit 700 and the second heat dissipating unit 710 can be more effectively cooled, and the heat generated by the heat generating elements 220 and 230 can be more effectively dissipated.

Third Exemplary Embodiment

Figure 9:
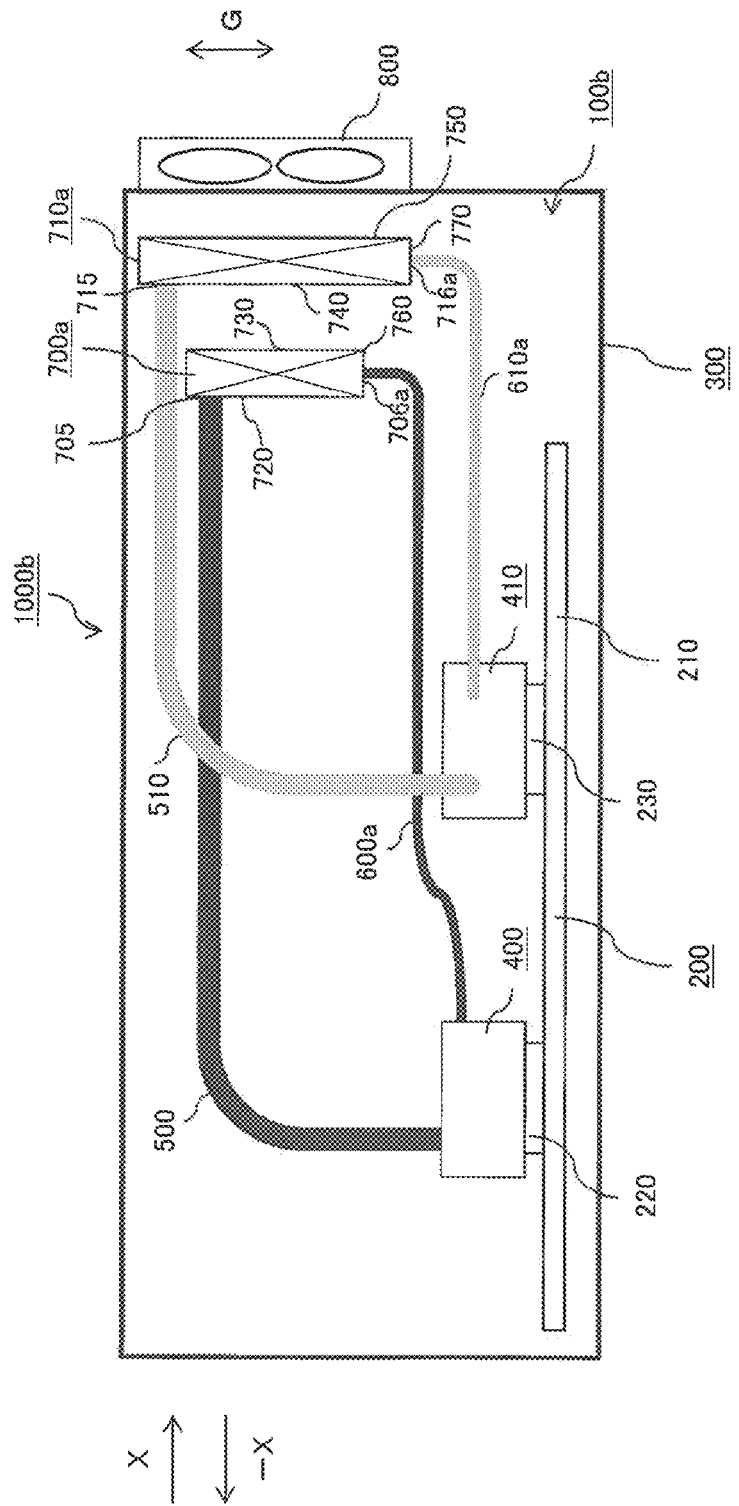
FIG. 9 is a side perspective view showing a structure of an electronic device including a cooling device according to a third exemplary embodiment of the present invention when viewed from a side.
Figure 10:
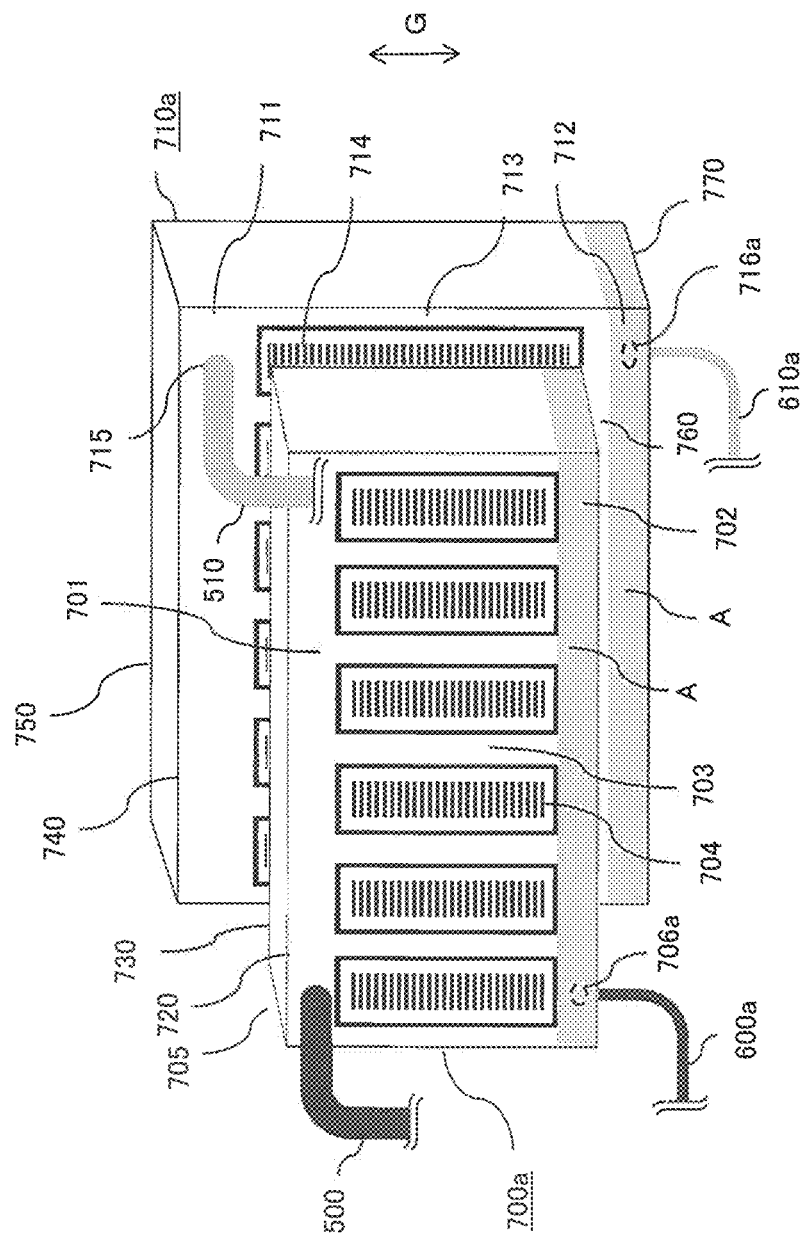
FIG. 10 is a perspective view showing a connection relationship between a heat dissipating unit and a liquid pipe.

A detailed structure of a cooling device 100b according to a third exemplary embodiment of the present invention will be described by using FIG. 9 and FIG. 10. FIG. 9 is a side perspective view showing a structure of an electronic device 1000b including the cooling device 100b according to the third exemplary embodiment of the present invention when viewed from the side. FIG. 10 is a perspective view showing a connection relationship between the first heat dissipating unit 700 and a first liquid pipe 600a and a connection relationship between the second heat dissipating unit 710 and a second liquid pipe 610a.

Further, in FIG. 9 and FIG. 10, the same reference numbers are used for the elements having the same function as the elements shown in FIG. 1 to FIG. 8.

The electronic device 1000b is composed of the cooling device 100b and the chassis 300.

As shown in FIG. 9, the cooling device 100b is composed of the first heat receiving unit 400, the second heat receiving unit 410, the first vapor pipe 500, the second vapor pipe 510, the first liquid pipe 600a, the second liquid pipe 610a, a first heat dissipating unit 700a, a second heat dissipating unit 710a, and the fan unit 800.

Here, the structure shown in FIG. 1 is compared with the structure shown in FIG. 9. In FIG. 1, the first liquid pipe 600 is connected to the third principal surface 720. Further, the second liquid pipe 610 is connected to the second principal surface 740. In contrast, in FIG. 9, the first liquid pipe 600a is connected to a vertically lower side surface (a bottom face) 760 of the first heat dissipating unit 700a. Further, the second liquid pipe 610a is connected to a vertically lower side surface (a bottom face) 770 of the second heat dissipating unit 710a. This is a difference between the structure shown in FIG. 1 and the structure shown in FIG. 9. In the following description, the description about the structure that is the same as the structure shown in FIG. 1 to FIG. 8 will be omitted.

As shown in FIG. 9 and FIG. 10, a liquid pipe side joining portion 706a for heat dissipating unit of the first heat dissipating unit 700a is formed on the vertically lower side surface (the bottom face) 760. Further, a liquid pipe side joining portion 716a for heat dissipating unit of the second heat dissipating unit 710a is formed in the vertically lower side surface (the bottom face) 770.

As shown in FIG. 9 and FIG. 10, the first liquid pipe 600a is connected to the liquid pipe side joining portion 706a for heat dissipating unit of the first heat dissipating unit 700a. In other words, the first liquid pipe 600a is connected to the vertically lower side surface 760 of the first heat dissipating unit 700a.

Further, the second liquid pipe 610a is connected to the liquid pipe side joining portion 716a for heat dissipating unit of the second heat dissipating unit 710a. In other words, the second liquid pipe 610a is connected to the vertically lower side surface 770 of the second heat dissipating unit 710a.

Here, there is shown a structure in which the first liquid pipe 600a and the second liquid pipe 610a are connected to the vertically lower side surface 760 of the first heat dissipating unit 700a and the vertically lower side surface 770 of the second heat dissipating unit 710a, respectively. This structure is most preferable. Alternatively, one of the first liquid pipe 600a and the second liquid pipe 610a may be connected to the vertically lower side surface.

As described above, in order to circulate refrigerant between the first heat receiving unit 400 and the first heat dissipating unit 700a, the cooling device 100b according to the third exemplary embodiment of the present invention includes the first pipe unit and the second pipe unit. The first pipe unit connects the first heat receiving unit 400 and the first heat dissipating unit 700a. In order to circulate refrigerant between the second heat receiving unit 410 and the second heat dissipating unit 710a, the second pipe unit connects the second heat receiving unit 410 and the second heat dissipating unit 710a.

The first pipe unit includes the first vapor pipe 500 and the first liquid pipe 600a. In order to convey refrigerant from the first heat receiving unit 400 to the first heat dissipating unit 700a, the first vapor pipe 500 connects the first heat receiving unit 400 and the first heat dissipating unit 700a. In order to convey refrigerant from the first heat dissipating unit 700a to the first heat receiving unit 400, the first liquid pipe 600a connects the first heat receiving unit 400 and the first heat dissipating unit 700a.

The second pipe unit includes the second vapor pipe 510 and the second liquid pipe 610a. In order to convey refrigerant from the second heat receiving unit 410 to the second heat dissipating unit 710a, the second vapor pipe 510 connects the second heat receiving unit 410 and the second heat dissipating unit 710a. In order to convey refrigerant from the second heat dissipating unit 710a to the second heat receiving unit 410, the second liquid pipe 610a connects the second heat receiving unit 410 and the second heat dissipating unit 710a.

At least one of a structure in which the first liquid pipe 600a is connected to the vertically lower side surface 760 of the first heat dissipating unit 700a and a structure in which the second liquid pipe 610a is connected to the vertically lower side surface 770 of the second heat dissipating unit 710a is used.

As described above, the gas-phase refrigerant from the upper tank portions 701 changes to the liquid-phase refrigerant and the liquid-phase refrigerant flows through the connection pipe portion 703 in the vertically lower direction and flows into the lower tank portion 702 and similarly, the gas-phase refrigerant from the upper tank portion 711 changes to the liquid-phase refrigerant and the liquid-phase refrigerant flows through the connection pipe portion 713 in the vertically lower direction and flows into the lower tank portion 712. The liquid-phase refrigerant in the lower tank portions 702 and 712 flow into the first liquid pipe 600a and the second liquid pipe 610a, respectively.

In this case, in the cooling device 100b, the first liquid pipe 600a and the second liquid pipe 610a are connected to the vertically lower side surface (the bottom face) 760 of the first heat dissipating unit 700a and the vertically lower side surface (the bottom face) 770 of the second heat dissipating unit 710a, respectively. Accordingly, the liquid-phase refrigerant in the lower tank portion 702 of the first heat dissipating unit 700a and the liquid-phase refrigerant in the lower tank portion 712 of the second heat dissipating unit 710a can be smoothly conveyed to the first liquid pipe 600a and the second liquid pipe 610a, respectively, in comparison with, for example, a case in which the first liquid pipe 600a and the second liquid pipe 610a are connected to the surfaces (the side faces or the top faces other than the bottom faces) other than the vertically lower side surface (the bottom face) 760 and the vertically lower side surface (the bottom face) 770. As a result, the liquid-phase refrigerant can more smoothly flow out from the lower tank portion 702 of the first heat dissipating unit 700a and the lower tank portion 712 of the second heat dissipating unit 710a. Therefore, in the first heat dissipating unit 700a and the second heat dissipating unit 710a, the liquid-phase refrigerant in the lower tank portion 702 and the liquid-phase refrigerant in the lower tank portion 712 can easily flow into the first liquid pipe 600a and the second liquid pipe 610a without resistance, respectively.

As a result, the refrigerant can be more effectively circulated between the first heat receiving unit 400 and the first heat dissipating unit 700a. Similarly, the refrigerant can be more effectively circulated between the second heat receiving unit 410 and the second heat dissipating unit 710a. Therefore, the heat generated by the heat generating elements 220 and 230 can be more effectively dissipated.

Fourth Exemplary Embodiment

Figure 11:
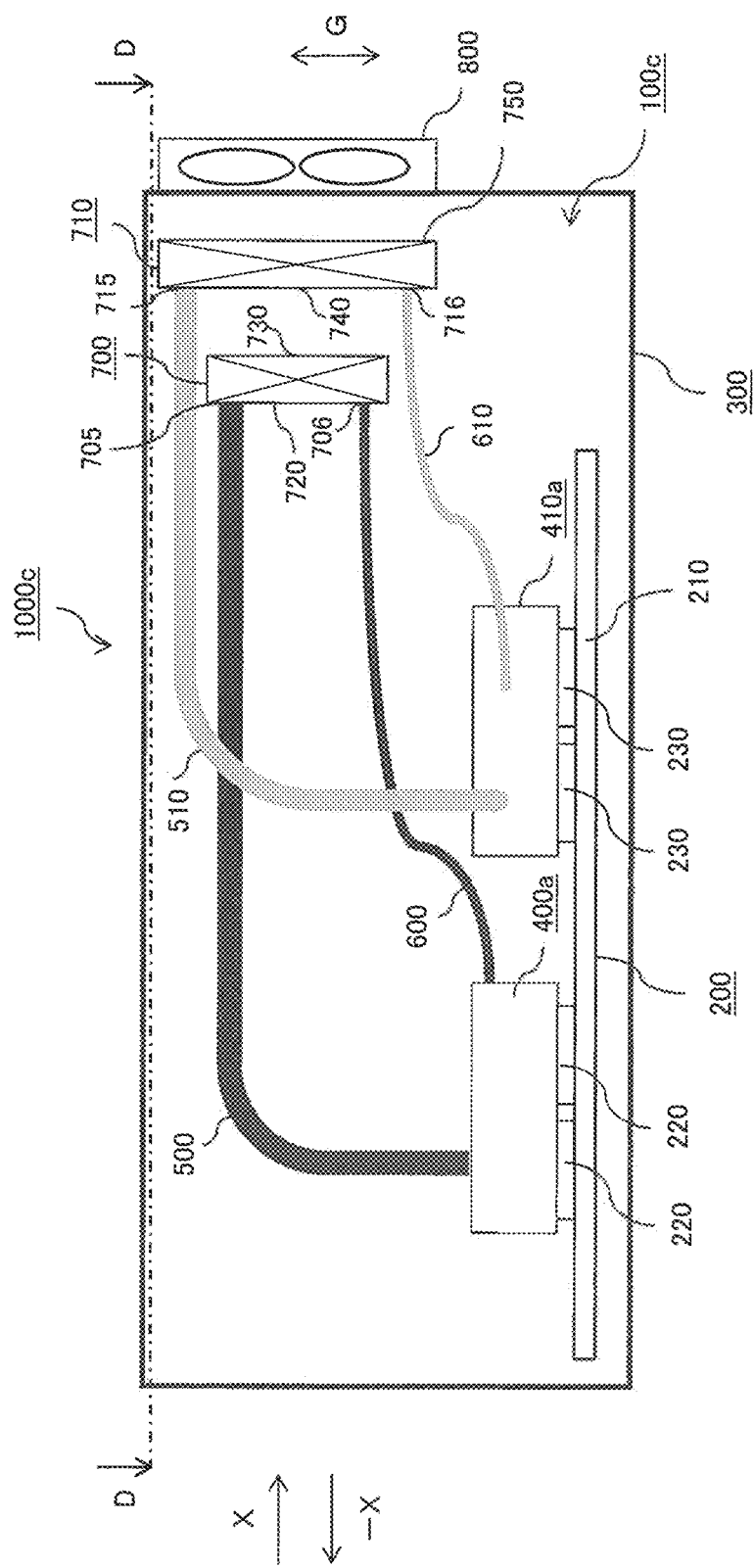
FIG. 11 is a side perspective view showing a structure of an electronic device including a cooling device according to a fourth exemplary embodiment of the present invention when viewed from a side.

A detailed structure of a cooling device 100c according to a fourth exemplary embodiment of the present invention will be described by using FIG. 11 and FIG. 12. FIG. 11 is a side perspective view showing a structure of an electronic device 1000c including the cooling device 100c according to the fourth exemplary embodiment of the present invention when viewed from the side. FIG. 12 is a top perspective view showing a cross section along a line D-D in FIG. 11. Further, in FIG. 11 and FIG. 12, the same reference numbers are used for the elements having the same function as the elements shown in FIG. 1 to FIG. 10.

The electronic device 1000c is composed of the cooling device 100c and the chassis 300.

As shown in FIG. 11, the cooling device 100c is composed of a first heat receiving unit 400a, a second heat receiving unit 410a, the first vapor pipe 500, the second vapor pipe 510, the first liquid pipe 600, the second liquid pipe 610, the first heat dissipating unit 700, the second heat dissipating unit 710, and the fan unit 800.

Here, the structure shown in FIG. 1 is compared with the structure shown in FIG. 11. In FIG. 1, the first heat receiving unit 400 and the second heat receiving unit 410 receive the heat generated by the heat generating elements 220 and 230, respectively. However, in FIG. 11, the first heat receiving unit 400a and the second heat receiving unit 410a receive the heat generated by a plurality of the heat generating elements 220 and a plurality of the heat generating elements 230, respectively. This is a difference between the structure shown in FIG. 1 and the structure shown in FIG. 11. In the following description, the description about the structure that is the same as the structure shown in FIG. 1 to FIG. 10 will be omitted.

As shown in FIG. 11 and FIG. 12, the first heat receiving unit 400a is mounted on the plurality of the heat generating elements 220. The first heat receiving unit 400a receives the heat generated by the plurality of the heat generating elements 220.

As shown in FIG. 11 and FIG. 12, the second heat receiving unit 410a is mounted on a plurality of the heat generating elements 230. The second heat receiving unit 410a receives the heat generated by a plurality of the heat generating elements 230.

Further, FIG. 11 and FIG. 12 show a structure in which the first heat receiving unit 400a and the second heat receiving unit 410a receive the heat generated by a plurality of the heat generating elements 220 and a plurality of the heat generating elements 230, respectively. However, a structure in which either the first heat receiving unit 400a or the second heat receiving unit 410a receives the heat generated by a plurality of the heat generating elements may be used.

Further, in FIG. 11 and FIG. 12, the number of the heat generating elements is two. However, the number of the heat generating elements is not limited to two.

As described above, in the cooling device 100c according to the fourth exemplary embodiment of the present invention, at least one of a structure in which the first heat receiving unit 400a receives the heat generated by a plurality of the heat generating elements 220 and a structure in which the second heat receiving unit 410a receives the heat generated by a plurality of the heat generating elements 230 can be used as the structure of the heat receiving unit. As a result, it is not necessary to dispose the first heat receiving unit 400a, the second heat receiving unit 410a, the first heat dissipating unit 700, and the second heat dissipating unit 710 depending on the numbers of a plurality of the heat generating elements 220 and a plurality of the heat generating elements 230. Accordingly, the number of parts used in the cooling device 100c can be reduced and the size of the cooling device 100c can be reduced.

As above, the present invention has been described based on the exemplary embodiments. An exemplary embodiment is just an illustration, and various kinds of changes, addition or subtraction and combinations may be added to each of the above-mentioned exemplary embodiments unless it deviates from the main points of the present invention. It is understood by a person skilled in the art that modification made by adding such changes, addition/subtraction and combinations are also included in the scope of the present invention.

This application claims priority based on Japanese application Japanese Patent Application No. 2014-005775, filed on Jan. 16, 2014, the disclosure of which is incorporated herein in its entirety.

REFERENCE SIGNS LIST 100, 100a, 100b, and 100c cooling device
200 electronic substrate
210 substrate
220 heat generating element
230 heat generating element
300 chassis
400 and 400a first heat receiving unit
401 fin portion for heat receiving unit
402 refrigerant boiling portion
403 vapor pipe side joining portion for heat receiving unit
404 liquid pipe side joining portion for heat receiving unit
410 and 410a second heat receiving unit
500 first vapor pipe
510 second vapor pipe
600 and 600a first liquid pipe
610 and 610a second liquid pipe
700 and 700a first heat dissipating unit
701 and 711 upper tank portion
702 and 712 lower tank portion
703 and 713 connection pipe portion
704 and 714 fin portion for heat dissipating unit
705 and 715 vapor pipe side joining portion for heat dissipating unit
706, 716, 706a, and 716a liquid pipe side joining portion for heat dissipating unit
710 and 710a second heat dissipating unit
720 third principal surface
730 first principal surface
740 second principal surface
750 fourth principal surface
760 and 770 vertically lower side surface
800 fan unit
900 cover portion
901 vapor pipe side opening for cover portion
902 liquid pipe side opening for cover portion
1000, 1000a, 1000b, and 1000c electronic device

The invention claimed is:

1. A cooling device comprising
   a first heat receiving unit and a second heat receiving unit that receive heat generated by heat generating elements,
   a first heat dissipating unit that has a first principal surface and dissipates the heat received by the first heat receiving unit, and
   a second heat dissipating unit that has a second principal surface and dissipates the heat received by the second heat receiving unit, wherein
   the first principal surface and the second principal surface are arranged so as to face to each other,
   air passes through the first heat dissipating unit and the second heat dissipating unit in a direction approximately perpendicular to the first principal surface and the second principal surface from the first heat dissipating unit toward the second heat dissipating unit, and
   the area of the second principal surface is larger than the area of the first principal surface, and
   the first principal surface and second principal surface are each formed in a rectangular shape, and
   a distance in a surface direction between both end sides of the first principal surface and a distance in a surface direction between both end sides of the second principal surface are slightly smaller than a distance between inner walls of a chassis which accommodates the first heat receiving unit and the second heat receiving unit, the first dissipating unit, and the second heat dissipating unit.

2. The cooling device according to claim 1 further comprising:
   a fan unit that blows air into a facing area in which the first principal surface and the second principal surface face each other, the facing area being part of the first principal surface and second principal surface.

3. The cooling device according to claim 1 further comprising:
   a cover portion that connects an outer peripheral edge of the first principal surface and an outer peripheral edge of the second principal surface.

4. The cooling device according to claim 1, in which the first and second heat receiving units and the first and second heat dissipating units are disposed along a direction approximately perpendicular to the first and second principal surfaces.

5. The cooling device according to claim 1 further comprising:
   a first pipe unit that connects the first heat receiving unit and the first heat dissipating unit for circulating refrigerant between the first heat receiving unit and the first heat dissipating unit, and
   a second pipe unit that connects the second heat receiving unit and the second heat dissipating unit for circulating refrigerant between the second heat receiving unit and the second heat dissipating unit, wherein
   a lead-out direction in which the first pipe unit is led out from the first heat receiving unit is opposite to a lead-out direction in which the second pipe unit is led out from the second heat receiving unit.

6. The cooling device according to claim 1 further comprising:

a first pipe unit that connects the first heat receiving unit and the first heat dissipating unit for circulating refrigerant between the first heat receiving unit and the first heat dissipating unit, and a second pipe unit that connects the second heat receiving unit and the second heat dissipating unit for circulating refrigerant between the second heat receiving unit and the second heat dissipating unit, wherein the first pipe unit includes a first vapor pipe and a first liquid pipe, the first vapor pipe connecting the first heat receiving unit and the first heat dissipating unit and conveying refrigerant from the first heat receiving unit to the first heat dissipating unit, the first liquid pipe connecting the first heat receiving unit and the first heat dissipating unit and conveying refrigerant from the first heat dissipating unit to the first heat receiving unit, the second pipe unit includes a second vapor pipe and a second liquid pipe, the second vapor pipe connecting the second heat receiving unit and the second heat dissipating unit and conveying refrigerant from the second heat receiving unit to the second heat dissipating unit, the second liquid pipe connecting the second heat receiving unit and the second heat dissipating unit and conveying refrigerant from the second heat dissipating unit to the second heat receiving unit, and the first liquid pipe is connected to a vertically lower side surface of the first heat dissipating unit or the second liquid pipe is connected to a vertically lower side surface of the second heat dissipating unit.

7. The cooling device according to claim 1 in which at least one of the first heat receiving unit and the second heat receiving unit receives heat generated by a plurality of heat generating elements.

8. An electronic device comprising:
the cooling device according to claim 1 and
a chassis that accommodates the cooling device.

* * * * *